United States Patent
Jang et al.

(10) Patent No.: US 11,024,618 B2
(45) Date of Patent: *Jun. 1, 2021

(54) WAFER-LEVEL UNDERFILL AND OVER-MOLDING

(71) Applicant: Taiwan Semiconductor Manufacturing Company, Ltd., Hsinchu (TW)

(72) Inventors: Bor-Ping Jang, Chu-Bei (TW); Chung-Shi Liu, Hsinchu (TW); Chien Ling Hwang, Hsinchu (TW); Yeong-Jyh Lin, Caotun Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 306 days.

This patent is subject to a terminal disclaimer.

(21) Appl. No.: 15/894,390

(22) Filed: Feb. 12, 2018

(65) Prior Publication Data
US 2018/0175013 A1    Jun. 21, 2018

Related U.S. Application Data

(60) Continuation of application No. 14/599,815, filed on Jan. 19, 2015, now Pat. No. 9,893,044, and a division of application No. 13/411,293, filed on Mar. 2, 2012, now Pat. No. 8,951,037.

(51) Int. Cl.
| | |
|---|---|
| *B29C 45/34* | (2006.01) |
| *H01L 25/00* | (2006.01) |
| *B29C 45/14* | (2006.01) |
| *B29C 45/00* | (2006.01) |

(52) U.S. Cl.
CPC .......... *H01L 25/50* (2013.01); *B29C 45/0046* (2013.01); *B29C 45/14639* (2013.01); *B29C 45/34* (2013.01); *B29C 2045/0027* (2013.01); *H01L 2224/16225* (2013.01); *H01L 2924/0002* (2013.01)

(58) Field of Classification Search
CPC .......... B29C 45/0046; B29C 45/14639; B29C 45/34
See application file for complete search history.

(56) References Cited

U.S. PATENT DOCUMENTS

| | | | |
|---|---|---|---|
| 3,108,339 A | 10/1963 | Bucy | |
| 5,540,576 A | 6/1996 | Kawakita et al. | |
| 5,762,855 A | 6/1998 | Betters et al. | |
| 5,964,030 A | 10/1999 | Lee et al. | |

(Continued)

FOREIGN PATENT DOCUMENTS

| | | |
|---|---|---|
| CN | 102005440 A | 4/2011 |
| JP | 2000040773 A | 2/2000 |

(Continued)

*Primary Examiner* — James Sanders
(74) *Attorney, Agent, or Firm* — Slater Matsil, LLP

(57) ABSTRACT

A mold includes a top portion, and an edge ring having a ring-shape. The edge ring is underlying and connected to edges of the top portion. The edge ring includes air vents. The edge ring further encircles the inner space under the top portion of the mold. A plurality of injection ports is connected to the inner space of the mold. The plurality of injection ports is substantially aligned to a straight line crossing a center of the top portion of the mold. The plurality of injection ports has different sizes.

20 Claims, 6 Drawing Sheets

(56) References Cited

U.S. PATENT DOCUMENTS

| | | |
|---|---|---|
| 6,245,595 B1 | 6/2001 | Nguyen et al. |
| 6,302,674 B1 | 10/2001 | Arakawa et al. |
| 6,770,236 B2 | 8/2004 | Miyajima |
| 6,797,542 B2 | 9/2004 | Kuratomi et al. |
| 7,482,701 B2 | 1/2009 | Ito et al. |
| 7,943,078 B2 | 5/2011 | Sekido et al. |
| 8,743,561 B2 | 6/2014 | Wang et al. |
| 2007/0235897 A1 | 10/2007 | Brunnbauer et al. |
| 2011/0003026 A1 | 1/2011 | Matsumoto |
| 2011/0169195 A1 | 7/2011 | Yoo |
| 2012/0146236 A1 | 6/2012 | Lin et al. |
| 2013/0115735 A1 | 5/2013 | Chen et al. |
| 2013/0228950 A1 | 9/2013 | DeSimone et al. |

FOREIGN PATENT DOCUMENTS

| | | |
|---|---|---|
| JP | 2012200996 A | 10/2012 |
| KR | 20060134105 A | 12/2006 |

WAFER-LEVEL UNDERFILL AND OVER-MOLDING

PRIORITY CLAIM AND CROSS-REFERENCE

This application is a continuation of U.S. patent application Ser. No. 14/599,815, entitled "Wafer-Level Underfill and Over-Molding," filed Jan. 19, 2015, which is a divisional of U.S. patent application Ser. No. 13/411,293, entitled "Wafer-Level Underfill and Over-Molding," filed on Mar. 2, 2012, which applications are incorporated herein by reference.

BACKGROUND

In the packaging of integrated circuits, package components, such as device dies and package substrates, are typically stacked through flip chip bonding. To protect the solder regions between the stacked package components, an underfill is disposed between the stacked package components. A molding compound may then be molded on the stacked package components through over-molding.

The conventional molding methods include compression molding and transfer molding. Compression molding may be used for the over-molding. Since the compression molding cannot be used to fill the underfill into the gaps between the stacked dies, the underfill needs to be dispensed in separate steps other than the compression molding. On the other hand, transfer molding may be used to fill a molding underfill into the gap between, and over, the stacked package components. Accordingly, transfer molding may be used to dispense the underfill and the molding compound in the same process step. Transfer molding, however, cannot be used on the packages including round wafers due to non-uniform dispensing of the molding compound.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An apparatus for wafer-level molding and the method of performing the wafer-level molding are provided in accordance with various exemplary embodiments. The variations of the embodiments are discussed. Throughout the various views and illustrative embodiments, like reference numbers are used to designate like elements.

Figure 1A:
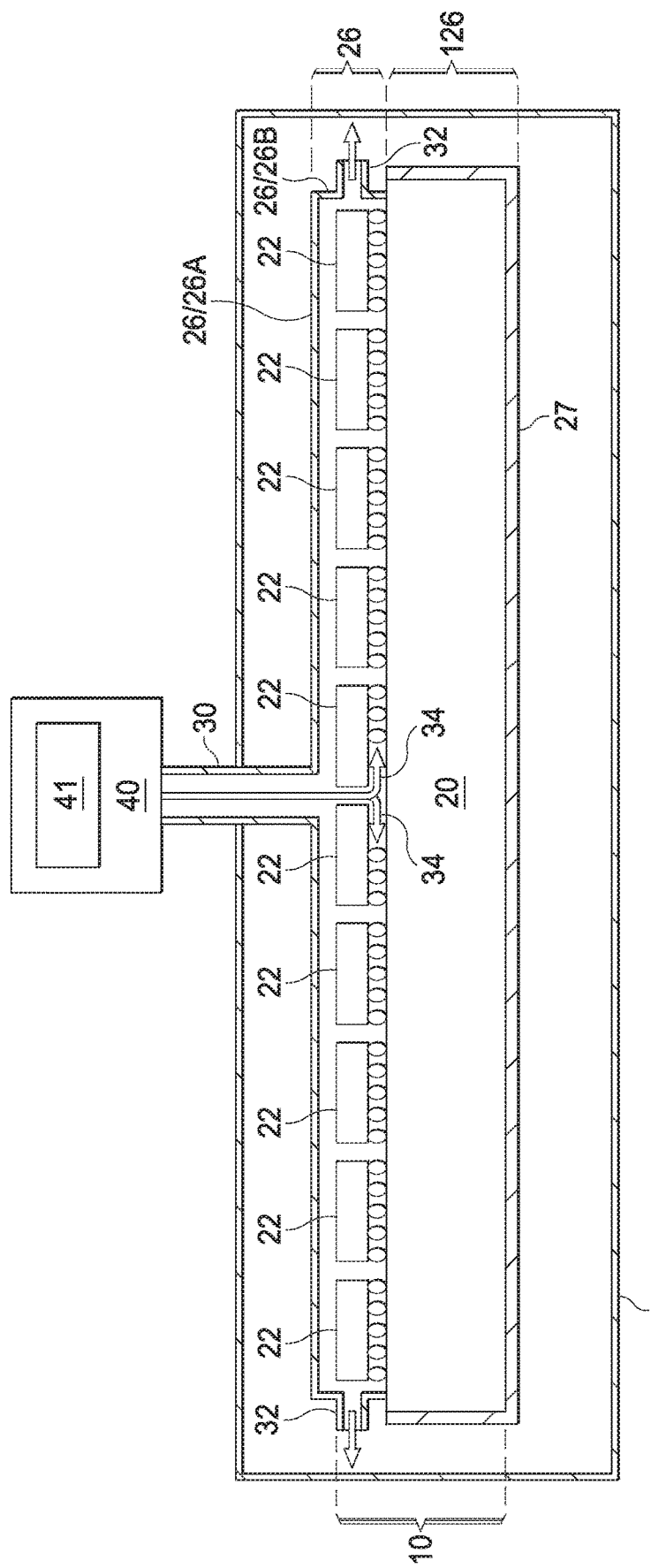
FIGS. 1A and 1B illustrate cross-sectional views of apparatuses in accordance with exemplary embodiments, wherein the apparatuses are used for performing a wafer-level molding.
Figure 1B:
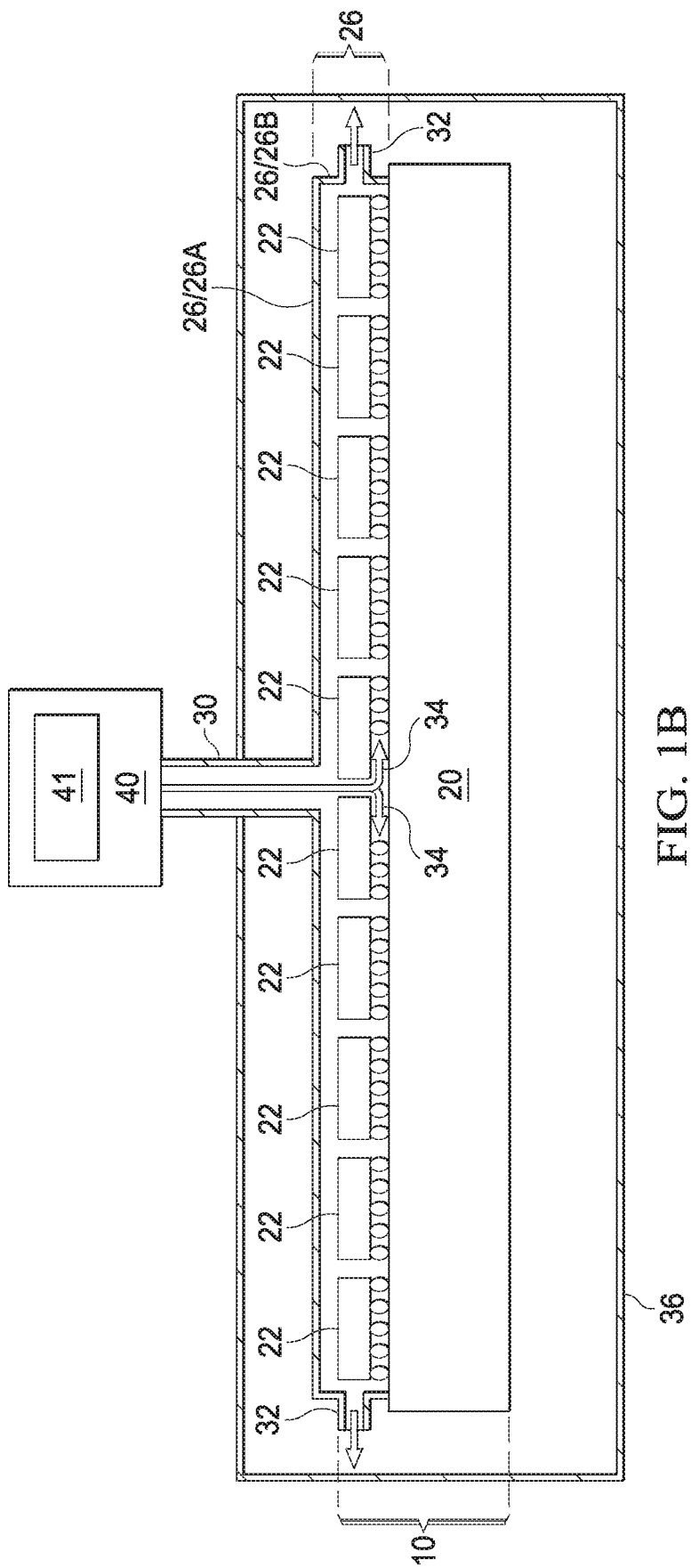
Figure 1C:
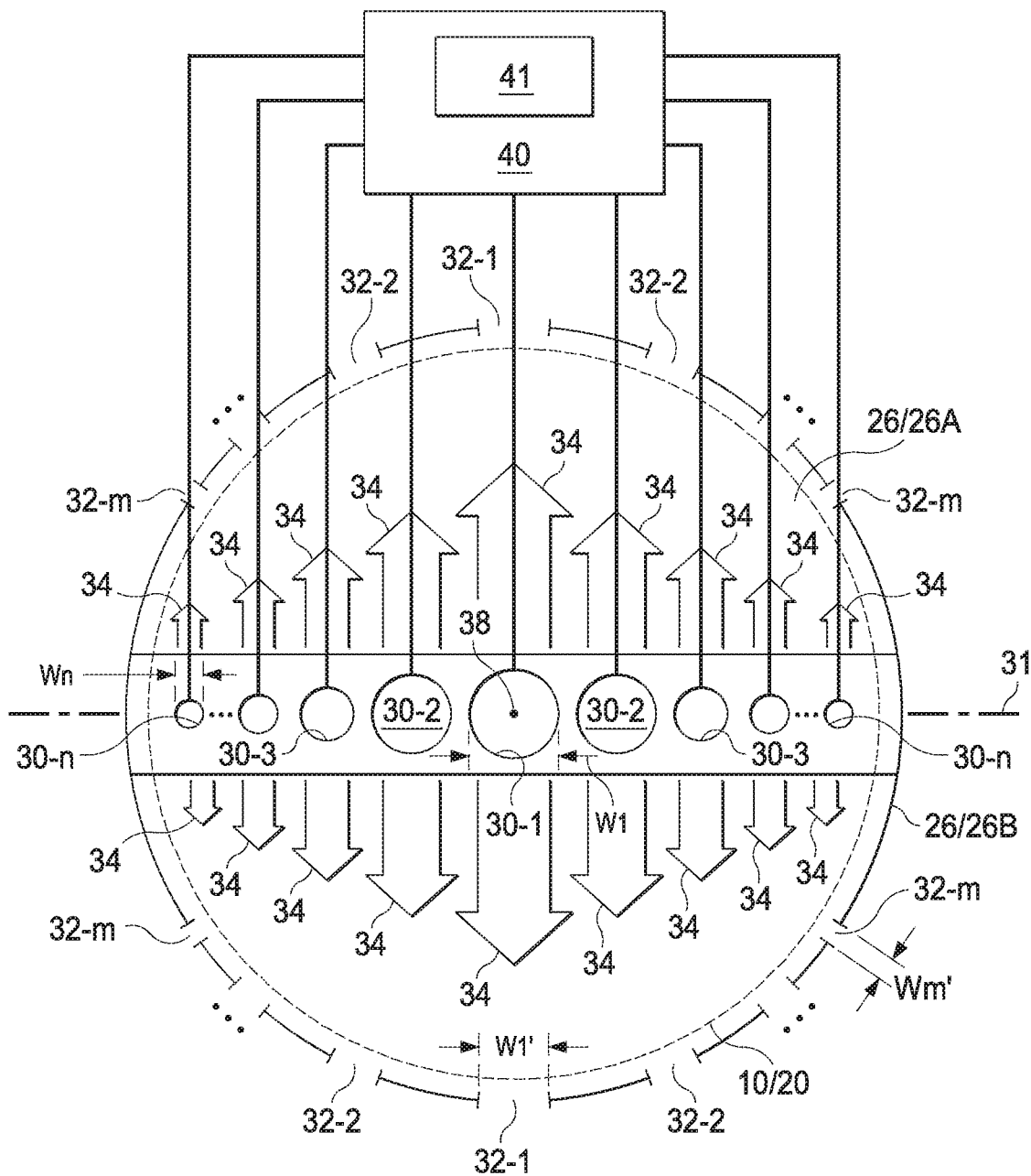
FIGS. 1C and 1D are a top view and a perspective view, respectively, of the apparatuses shown in FIGS. 1A and 1B.

FIGS. 1A and 1B illustrate cross-sectional views of a wafer-level molding process. Referring to FIG. 1A, package structure 10 is placed in mold 26. Package structure 10 includes wafer 20, and dies 22 bonded to wafer 20. In some embodiments, wafer 20 is a device wafer, which includes a plurality of device chips including active devices (such as transistors) therein. In alternative embodiments, wafer 20 is an interposer wafer, which is free from active devices therein. Wafer 20 may, or may not, include passive devices such as resistors, capacitors, and inductors, therein. The top view of wafer 20 may be rounded, for example, as shown in FIG. 1C, although wafer 20 may have other top view shapes. Dies 22 may be device dies including active devices therein. Alternatively, dies 22 may be packages including stacked dies.

Mold 26 includes top portion (a cover) 26A, which may have a round top-view shape (FIG. 1C). As shown in FIG. 1A, the top surfaces of dies 22 are spaced apart from top portion 26A of mold 26 by a space. Mold 26 further includes edge ring 26B, which encircles dies 22. Edge ring 26B is connected to, and extends down from, the edges of top portion 26A. Edge ring 26B encircles a region underlying top portion 26A, which region is referred to as the inner space of mold 26 hereinafter. Mold 26 may be formed of steel, stainless steel, ceramic, or the like. In some embodiments, as shown in FIG. 1A, mold 126, which is a lower mold, may be placed under mold 26. Molds 26 and 126 are used in combination for molding package 10. In alternative embodiments, as shown in FIG. 1B, the bottom edge of edge ring 26B is placed on the edge portions of wafer 20. In these embodiments, no lower mold is needed.

As shown in FIGS. 1A and 1B, one or a plurality of injection ports 30 is disposed to penetrate through top portion 26A of mold 26. Molding material 34 is injected into mold 26 through injection ports 30. Portions of molding material 34 flow into the gaps between dies 22. These portions of molding material 34 may perform the function of an underfill. In addition, portions of molding material 34 flow into the gaps between dies 22, and into the space between dies 22 and top portion 26A of mold 26. These portions of molding material 34 are used for over-molding. Accordingly, as shown in FIGS. 1A and 1B, the underfill dispensing and the over-molding are performed in the same step. Molding material 34 may be a molding underfill or another other type of polymer that can be used for molding.

Edge ring 26B of mold 26 includes a plurality of air vents 32, which are through holes connecting the inner space of mold 26 to the external space. Air vents 32 are used to allow the venting of the air in the inner space of mold 26. Air vents 32 may be distributed throughout edge ring 26B. In some embodiments, air vents 32 are used to vacuum the inner space of mold 26, so that it is easy for molding material 34 to flow from the center of mold 26 to the edge. With the venting/vacuuming through air vents 32, it is less likely to have air bubbles formed in the resulting dispensed molding material 34.

FIG. 1C illustrates a top view of the apparatus in FIGS. 1A and 1B. In some embodiments, mold 26 has a top-view shape similar to the top-view shape of wafer 20. The top portion of mold 26 may be rounded, and has center 38, which may also be substantially aligned to the center of wafer 20. Injection ports 30 are denoted as 30-1 through 30-$n$, wherein integer n may be any suitable number. Throughout the description, injection ports 30 that are closer to center 38 are referred to as inner ports, and injection ports 30 that are farther away from center 38 are referred to as outer ports. It is appreciated that the terms "inner" and "outer" are relative to each other. For example, injection port 30-2 is an outer port when compared to injection port 30-1, and is an inner port when compared to injection port 30-3. Injection port 30-1 is closest to center, and hence is referred to as center port 30-1 hereinafter. Injection ports 30-n are closest to the edge of mold 26, and are referred to as edge ports hereinafter.

In some embodiments, injection ports 30 are substantially aligned to straight line 31, which crosses center 38 of the top portion 26A of round mold 26. Molding material 34 (FIG. 1A) is injected into mold 26 through the plurality of injection ports 30, and flows to the edge of mold 26. In some embodiments, size W1, which may be a diameter or a length/width, of center port 30-1 is greater than size Wn of edge ports 30-n. Ratio W1/Wn may be greater than 1, and may also be greater than about 5. Injection ports 30-1 through 30-n may also have increasingly smaller sizes, and each of the outer ports may have a size smaller than its inner ports. Accordingly, more molding material 34 is injected through injection ports 30 that are closer to center 38 than the molding material 34 that is injected through injection ports 30 that are closer to the edges of mold 26. The portion of molding material 34 injected through center port 30-1 needs to travel a greater distance (and fill a greater space) than the portion of molding material 34 injected through edge ports 30-n. Accordingly, by designing injection ports 30 with different sizes, the portions of molding material 34 injected through different injection ports 30 may flow (in the direction of the arrows in FIG. 1C) to the edge of mold 26 at substantially the same time. The possibility of the formation of voids in molding material 34 is thus reduced.

In some exemplary embodiments, molding material 34 may be injected through injection ports 30 simultaneously. In alternative embodiments, molding material 34 is injected from different injection ports 30 at different times. In some exemplary embodiments, center port 30-1 starts injecting molding material 34 first, while other injection ports 30 lag behind in injecting than the respective inner ports. Edge ports 30-n may start injecting at a time after all the inner injection ports 30 have started injecting. In some exemplary embodiments, the staring injection time of edge ports 30-n may lag the starting injection time of center port 30-1 by a time difference greater than about 70 seconds.

FIGS. 1A through 1C also illustrate molding dispenser 40, which is connected to injection ports 30, and is configured to conduct molding material 34 to injection ports 30. Molding dispenser 40 includes controller 41, which is configured to control the timing of the injection through different ports 30.

Figure 1D:
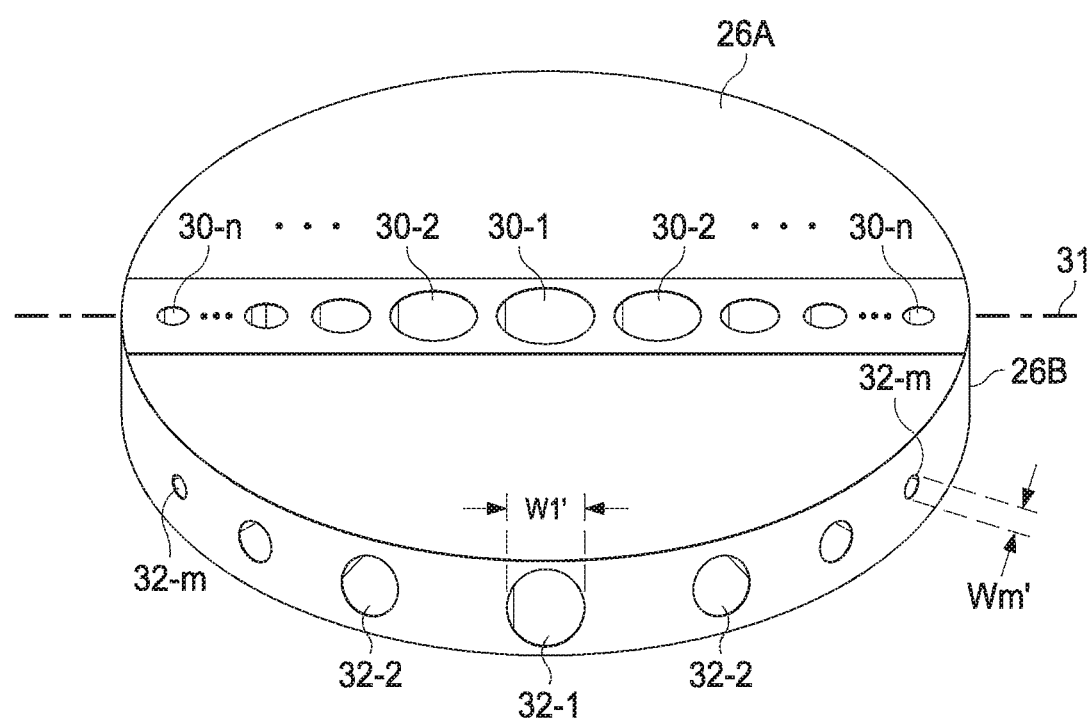

FIG. 1D illustrates a perspective view of the structures shown in FIGS. 1A through 1C. In some embodiments, air vents 32 (including 32-1 through 32-m) have a uniform size, wherein the sizes may be the diameters or the lengths/widths, depending on the shapes of air vents 32. In alternative embodiments, air vents 32 have different sizes depending on wherein the respective air vents 32 are located. For example, air vent 32-1 is farthest from injection ports 30 and from line 31, to which injection ports 30 are aligned. Air vent 32-1 may have the greatest size W1' among all sizes of air vents 32. Air vent 32-m, which are closest to injection ports 30 and line 31, may have the smallest size Wm'. Air vents 32-1 through 32-m may have increasingly smaller sizes. In some embodiments, ratio W1'/Wm' may be greater than 1, or greater than about 5. Through air vents 32, the inner space inside mold 26 may be vacuumed. For example, pipes (not shown) may be connected to air vents 32, and the vacuuming may be performed through the pipes. Alternatively, as shown in FIGS. 1A and 1B, the entire mold 26 may be placed in vacuumed environment 36, so that all air vents 32 are used for vacuuming the inner space of mold 26 at the same time. In the embodiments wherein vacuumed environment 36 is provided, no pipe needs to be connected to individual air vents 32. With the air vents 32 having different sizes, molding material 34 may be dispensed more uniformly throughout wafer 20.

Figure 2A:
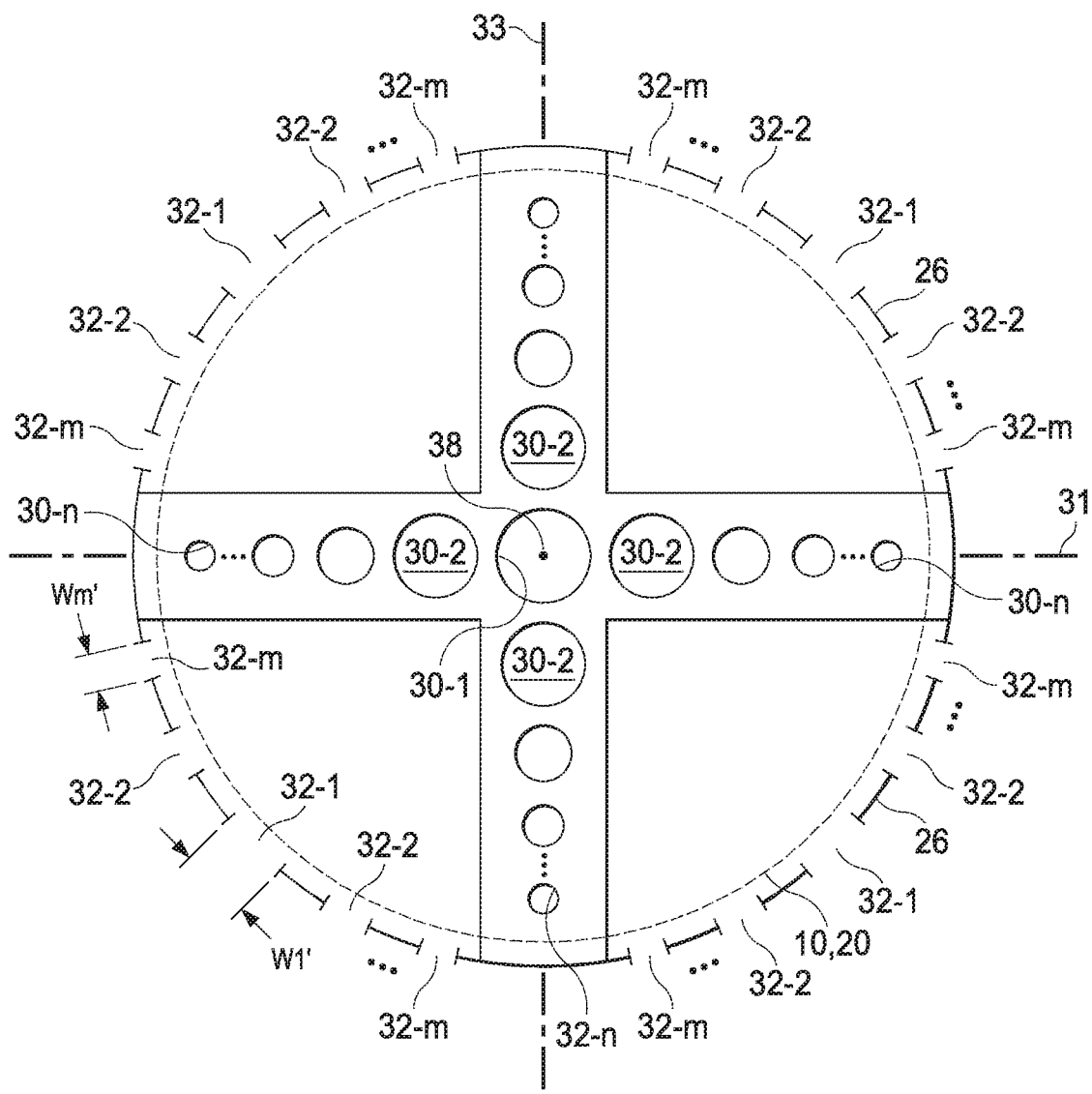
FIGS. 2A and 2B illustrate a top view and a perspective view, respectively, of the apparatuses in accordance with alternative embodiments.
Figure 2B:
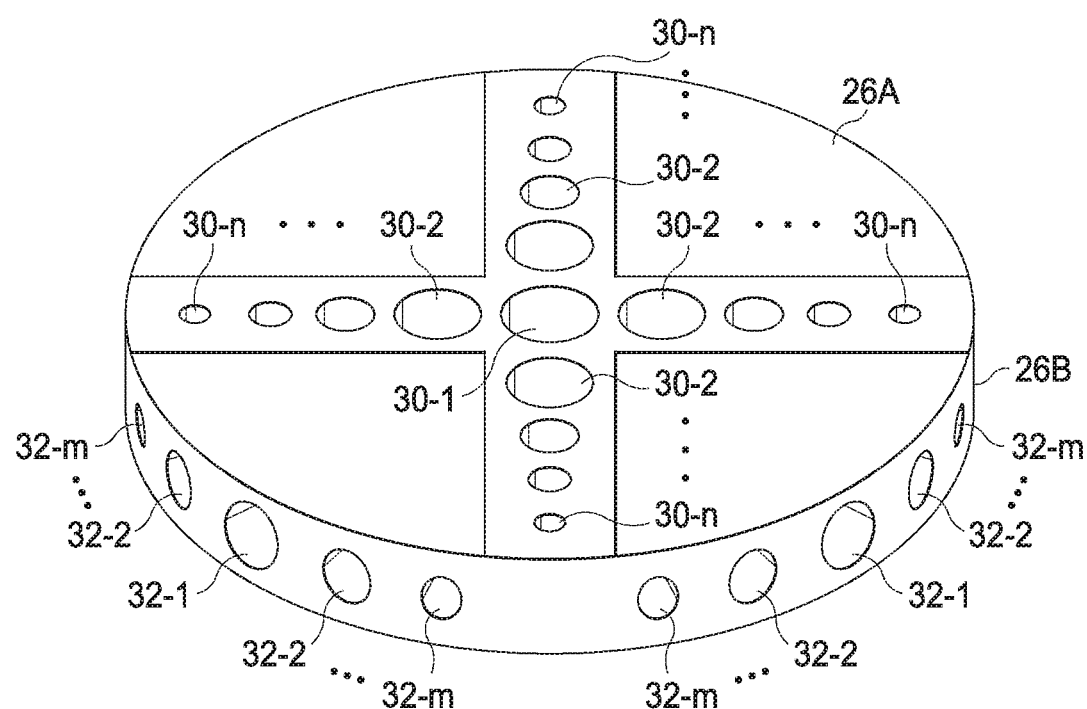

FIGS. 2A and 2B illustrate a top view and a perspective view, respectively, of the apparatus used for the wafer-level molding in accordance with alternative embodiments. Unless specified otherwise, the materials and the processes in these embodiments are essentially the same as the like components, which are denoted by like reference numerals in the embodiment shown in FIGS. 1A through 1D. The details of the embodiments shown in FIGS. 2A and 2B may thus be found in the discussion of the embodiments shown in FIGS. 1A through 1D. Referring to FIG. 2A, the plurality of ports 30-1 through 30-n may be distributed to align to straight lines 31 and 33, which are perpendicular to each other. Both straight lines 31 and 33 may cross center 38 of mold 26. Similar to the embodiments in FIGS. 1A through 1D, injection ports 30 that are closer to center 38 may have greater sizes than injection ports 30 that are farther away from center 38. Furthermore, molding material 34 may be injected through inner injection ports 30 earlier than through the respective outer injection ports 30.

FIG. 2B illustrates a perspective view of the apparatus in FIG. 2A. In some embodiments, air vents 32 have a uniform size. In alternative embodiments, air vents 32 have different sizes. For example, air vents 32-1, which are farthest from injection ports 30 and lines 31 and 33, may have the greatest sizes, while air vents 32-m, which are closest to injection ports 30 and lines 31 and 33, may have the smallest sizes.

In the embodiments, through the adjustment of the sizes of the injection ports, the sizes of the air vents, and/or the starting times of the injection through different injection ports, the molding material may be dispensed at a greater rate to the center of the package than to the edge portions. Accordingly, a more uniform molding may be achieved.

In accordance with embodiments, a mold includes a top portion, and an edge ring having a ring-shape. The edge ring is underlying and connected to edges of the top portion. The edge ring includes air vents. The edge ring further encircles the inner space under the top portion of the mold. A plurality of injection ports is connected to the inner space of the mold. The plurality of injection ports is substantially aligned to a straight line crossing a center of the top portion of the mold. The plurality of injection ports has different sizes.

In accordance with other embodiments, a mold includes a top portion having a round edge, and an edge ring connected to the round edge of the top portion. The top portion and the edge ring of the mold define an inner space therein. A plurality of air vents penetrates through the edge ring of the mold, wherein the plurality of air vents have different sizes. A center injection port penetrates through the top portion of the mold and connected to the inner space of the mold. The center injection port is substantially aligned to the center of the top portion of the mold.

In accordance with yet other embodiments, a method includes providing a mold including a top portion, and an edge ring underlying and connected to the top portion. The edge ring encircles an inner space underlying the top portion. A package structure is placed into the inner space. The package structure includes a wafer, and a plurality of dies bonded to the wafer. At a first time, a molding material starts to be injected into the inner space from a first injection port that penetrates through the top portion of the mold. At a second time later than the first time, the molding material starts to be injected into the inner space from a second injection port that penetrates through the top portion of the mold. The second injection port is farther away from a center of the top portion of the mold than the first injection port.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus comprising:
   a mold comprising:
   a top portion;
   an edge ring having a ring-shape, wherein the edge ring is underlying and connected to edges of the top portion, and wherein the edge ring encircles an inner space under the top portion;
   a plurality of injection ports in communication with the inner space of the mold, wherein the plurality of injection ports are aligned to a diameter of the top portion of the mold; and
   a plurality of venting ports on the edge ring, wherein in a top view of the mold, the plurality of venting ports comprise:
   a first venting port having a first distance from the diameter; and
   a second venting port having a second distance from the diameter, wherein the first distance is greater than the second distance, and the first venting port is larger than the second venting port.

2. The apparatus of claim 1, wherein sizes of the plurality of venting ports increase with respective distances from the diameter.

3. The apparatus of claim 1, wherein each of the plurality of venting ports has a size different from sizes of respective neighboring venting ports among the plurality of venting ports.

4. The apparatus of claim 1 further comprising a dispenser connected to the plurality of injection ports, wherein the dispenser is configured to inject a molding material into the inner space of the mold through the plurality of injection ports.

5. The apparatus of claim 4 further comprising a controller connected to the dispenser, wherein the controller is configured to start dispensing the molding material through different ones of the plurality of injection ports at different times.

6. The apparatus of claim 5, wherein the controller is configured to start injecting the molding material into ports of the plurality of injection ports that are closer to a center of the diameter earlier than into respective ports farther away from the center of the diameter.

7. The apparatus of claim 1, wherein the top portion of the mold has a round top-view shape, wherein the plurality of injection ports comprise a center port close to a center of the top portion, and an edge port farther away from the center than the center port, and wherein the center port has a size greater than a size of the edge port.

8. The apparatus of claim 7, wherein in a direction from the center to an edge of the top portion of the mold, the plurality of injection ports have increasingly smaller sizes.

9. An apparatus comprising:
   a mold comprising:
   a top portion comprising a round edge;
   an edge ring connected to the round edge of the top portion, wherein the top portion and the edge ring define an inner space therein;
   a first venting port and a second venting port aligned to a first diameter of the top portion of the mold;
   a first plurality of venting ports on a first side of the first diameter; and
   a second plurality of venting ports on a second side of the first diameter opposite to the first side, wherein the first and second plurality of venting ports penetrate through the edge ring, wherein the first plurality of venting ports are symmetrical to the second plurality of venting ports with respect to the first diameter, and first ones of the first plurality of venting ports farther away from the first diameter are smaller than second ones of the first plurality of venting ports closer to the first diameter.

10. The apparatus of claim 9, wherein each of the first plurality of venting ports has a size different from at least one immediate neighboring venting port among the first plurality of venting ports.

11. The apparatus of claim 9, wherein the first plurality of venting ports further comprise a first sub portion and a second sub portion, each including an additional plurality of venting ports, wherein the first sub portion and the second sub portion are symmetric with respect to a second diameter of the top portion of the mold, and the second diameter is perpendicular to the first diameter.

12. The apparatus of claim 11, wherein neighboring ones of the additional plurality of venting ports in the first sub portion have different sizes.

13. The apparatus of claim 11, wherein no venting port is aligned to the second diameter.

14. The apparatus of claim 9 further comprising:
   a plurality of injection ports aligned to a second diameter of the top portion of the mold, wherein the second diameter is perpendicular to the first diameter, wherein venting ports among the plurality of injection ports and closer to a center of the top portion are larger than venting ports among the plurality of injection ports and farther away from the center.

15. The apparatus of claim 14 further comprising:
   a dispenser connected to the plurality of injection ports, wherein the dispenser is configured to inject a molding material into the inner space of the mold through the plurality of injection ports; and
   a controller connected to the dispenser, wherein the controller is configured to control the dispenser to dispense the molding material into different ones of the plurality of injection ports at different starting times.

16. The apparatus of claim 15, wherein the controller is further configured to control the dispenser to start dispensing the molding material into the plurality of injection ports that are closer to the center of the top portion earlier than venting ports among the plurality of injection ports that are farther away from the center.

17. An apparatus comprising:
   a mold comprising:
      a top portion having a center;
      an edge ring connected to edges of the top portion, wherein the edge ring comprises a bottom forming a ring, and an entirety of the bottom ring is coplanar; and
      a first plurality of venting ports penetrating through the edge ring, wherein the first plurality of venting ports are on a same first side of a diameter of the top portion of the mold, wherein a first venting port in the first plurality of venting ports is larger than second venting ports in the first plurality of venting ports, and the second venting ports are on opposite sides of the first venting port; and
   a dispenser configured to inject a molding material into the mold.

18. The apparatus of claim 17 further comprising a second plurality of venting ports penetrating through the edge ring, wherein the second plurality of venting ports are on a same second side of the diameter, and the first plurality of venting ports and the second plurality of venting ports are symmetric with relative to the diameter.

19. The apparatus of claim 18 further comprising a plurality of injection ports aligned to the diameter.

20. The apparatus of claim 19, wherein the plurality of injection ports have different sizes, with first ones closer to a center of the top portion being larger than second ones farther away from the center.

* * * * *